(12) United States Patent
Eissler

(10) Patent No.: US 6,899,761 B2
(45) Date of Patent: May 31, 2005

(54) SINGLE CRYSTALS OF LEAD MAGNESIUM NIOBATE-LEAD TITANATE

(75) Inventor: Elgin E. Eissler, Renfrew, PA (US)

(73) Assignee: II-VI Incorporated, Saxonburg, PA (US)

( * ) Notice: Subject to any disclaimer, the term of this patent is extended or adjusted under 35 U.S.C. 154(b) by 51 days.

(21) Appl. No.: 10/380,232
(22) PCT Filed: Sep. 12, 2001
(86) PCT No.: PCT/US01/28592
  § 371 (c)(1),
  (2), (4) Date: Mar. 11, 2003
(87) PCT Pub. No.: WO02/22917
  PCT Pub. Date: Mar. 21, 2002

(65) Prior Publication Data
  US 2003/0154911 A1 Aug. 21, 2003

Related U.S. Application Data
(60) Provisional application No. 60/231,635, filed on Sep. 11, 2000.

(51) Int. Cl.[7] ............... C30B 13/02; C30B 13/14; C30B 13/16; C30B 13/28
(52) U.S. Cl. ............................... 117/83; 117/81
(58) Field of Search ................... 117/81, 83

(56) References Cited

U.S. PATENT DOCUMENTS

| | | |
|---|---|---|
| 5,501,876 A | 3/1996 | Gesemann et al. |
| 5,554,219 A | 9/1996 | Fukuda et al. |
| 5,833,875 A | 11/1998 | Hayashi et al. |
| 5,989,395 A | 11/1999 | Tomozawa et al. |
| 5,998,910 A | 12/1999 | Park et al. |

*Primary Examiner*—Felisa Hiteshew
(74) *Attorney, Agent, or Firm*—Webb Ziesenheim Logsdon Orkin & Hanson, P.C.

(57) ABSTRACT

A method of making a single crystal of lead magnesium niobate-lead titanate (PMN-PT). The method includes providing a flat-bottomed iridium crucible containing PMN-PT starting material, and placing the crucible into a vertical Bridgman furnace having at least two temperature zones, which is subsequentially pressured with an inert gas. The crucible then descends into the temperature zones of the vertical Bridgman furnace. The temperature zones of the vertical Bridgman furnace include a first temperature zone having a temperature higher than a melting temperature of the PMN-PT material and a second temperature zone having a temperature less than the melting temperature of the PMN-PT material. The single crystals of the PMN-PT prepared using the above-described method exhibits a [110] crystal orientation and may be used in electroacoustic transducers. The electroacoustic transducers are useful in devices that detect or generate acoustic waves.

18 Claims, 2 Drawing Sheets

SINGLE CRYSTALS OF LEAD MAGNESIUM NIOBATE-LEAD TITANATE

This application claims the benefit of Provisional Application No. 60/231,635, filed Sep. 11, 2000.

BACKGROUND OF INVENTION

1. Field of the Invention

This invention relates to the growth of single crystals of lead magnesium niobate-lead titanate (PMN-PT) grown near the morphotropic phase boundary. These ferro-relaxor single crystals are useful in various military, medical, and industrial sonic transduction applications.

2. Brief Description of the Prior Art

Piezoelectric materials are materials that expand and/or contract when an electric field is applied to them. Conversely, they also will produce an electric field across themselves if a mechanical force is applied to them. Common uses for materials possessing the piezoelectric effect are in gas lighters, high frequency speakers, weighing devices, and micro-positioners, to mention a few. The piezoelectric effect occurs in materials with an asymmetric crystal structure. When an external force is applied, the charge centers of the crystal structure separate creating electric charges on the surface of the crystal. As mentioned above, the effect is also reversible. Electric charges on the crystal will cause a mechanical deformation of the crystal. Quartz, turmalin, and seignette are common natural piezoelectric materials.

One area of emphasis in the art of piezoelectric materials has been directed to making polycrystalline ceramic piezoelectrics because physical properties can be tailored to a given application. Common ceramic piezoelectric materials are lead-zirconate-titanate (PZT) and lead-magnesium-niobate (PMN). Piezoelectric materials typically deform linearly in response to an applied electric field. Because the strains in piezoelectrics are small, piezoelectric actuators are used mainly in speakers or precision micro-positioning applications where small and precise motion is needed.

Piezoelectric ceramics are currently the material of choice for ultrasonic transducer applications, offering relatively high coupling, a wide range of dielectric constants, and low dielectric loss. These merits translate into transducer performance in the form of relatively high sensitivity, broad bandwidth, impedance matching, and minimal thermal heating.

Relaxor-ferroelectrics are similar to piezoelectrics except that strain is produced by a second order electrostrictive effect as opposed to the first order effect. The most widely studied relaxor material is the PMN-PT solid solution system. This material is among the most widely used so called, "smart" materials. Achieving high quality single crystals of solid solution lead magnesium niobate-lead titanate (PMN-PT) greatly enhances the electromechanical properties of the PMN-PT as compared to the ceramic form. Obtaining high quality single crystals of PMN-PT is a significant objective in the art of piezoelectric materials.

PMN-PT has been grown by several techniques including flux, top seeded flux, and vertical Bridgman methods. To date, the vertical Bridgman method has been the most successful in producing large single crystals of PMN-PT. As shown in FIG. 1, a crucible system 10 with a flat bottom section 11 may used in the vertical Bridgman method. In this example, a piece of an oriented crystal seed 16 is placed at the bottom 11 of a platinum crucible 12 with a hermetically sealed lid 18 to seed crystal growth. During crystal growth, a crystal 14 forms from solidification of the melt, and the orientation of the seed crystal is propagated throughout the entire crystal. An important feature of the vertical Bridgman method is that the crystal shape is controlled by the crucible shape. However, the Bridgman method has several disadvantages, including crucible-melt compatibility (chemical and thermal), the presence of mechanical stress (crucible/crystal contraction), compositional segregation (stoichiometry, impurities), crucible cost, and removal of the crystal from the crucible.

Another approach is to grow single crystal of PMN-PT is shown in FIG. 2, which shows a crucible system 20 with a conical bottom section 21. In this case, the use of a seed is optional. As the melt solidifies at the bottom 21 of the inverted cone shape of a platinum crucible 22, several grains of various orientations form simultaneously. One of the grains will grow faster than the others and eventually choke off the growth of the other grains as the solidified crystal propagates upward in the inverted conical section of the crucible. The result is the formation of a crystal having a major grain 24 and one or more minor grains 26. This process is known as grain selection.

The grain selection method has several disadvantages. The seed is usually made of the same material of the crystal being grown and, therefore, has the same melting point. Special precautions and crucible design must be employed to prevent the melting of the seed during the initial period of the growth. With a conical crucible bottom 21, a large portion of the total length of the grown crystal is taken up by the conical section rather than the desired full diameter cylindrical section. In addition, a portion of the conical section consists of several grains before the point of a single crystal is obtained.

In current practice, crucibles are made from very thin platinum metal. After the starting materials are placed in the crucible, a platinum lid is welded to the crucible to form a hermetically sealed container. The sealed crucible prevents lead oxide vapor from escaping from the crucible during growth. The wall of the crucible is thin because the coefficient of thermal expansion of the platinum is greater than that of the PMN-PT. As the crystal cools, the contraction of the crucible is greater than that of the crystal resulting in the creation of compressive forces within the crystal. The thin crucible wall partially relieves these stresses.

Such methods for producing PMN-PT single crystals are disclosed in U.S. Pat. No. 5,998,910 to Park et al., the disclosure of which is herein incorporated by reference.

There remains a need for a method to produce PMN-PT single crystals that does not rely on seeds or a conical bottomed crucible, but achieves a single crystal of specific orientation from a flat-bottomed crucible in such a way that it is easily removed from the crucible.

These and other advantages of the present invention will be clarified in the description of the preferred embodiment taken together with the attached drawings in which like reference numerals represent like elements throughout.

SUMMARY OF THE INVENTION

The present invention is directed to a method of making a single grain crystal of lead magnesium niobate-lead titanate (PMN-PT). The method includes:

(a) providing a flat-bottomed iridium crucible containing PMN-PT starting materials;

(b) placing the crucible containing the PMN-PT starting material into a vertical Bridgman furnace having at least two temperature zones and pressurizing the interior of the furnace with an inert gas; and (c) descending the crucible into the temperature zones of the vertical Bridgman furnace, where the temperature zones include:

(i) a first temperature zone having a temperature higher than the melting temperature of the PMN-PT material; and (ii) a second temperature zone having a temperature less than the melting temperature of the PMN-PT material.

The present invention is further directed to single grain single crystals of PMN-PT prepared using the above-described method.

The present invention is also directed to electroacoustic transducers that include the single crystal of PMN-PT described above. In addition, the present invention is directed to devices that include such an electroacoustic transducer to detect or generate acoustic waves.

DESCRIPTION OF THE PREFERRED EMBODIMENT

Unless otherwise indicated, all numbers or expressions referring to quantities of ingredients, reaction conditions, etc. used herein are to be understood as modified in all instances by the term "about."

Various numerical ranges are disclosed in this patent application Because these ranges are continuous, they include every value between the minimum and maximum values. Unless expressly indicated otherwise, the various numerical ranges specified in this application are approximations.

Figure 2:
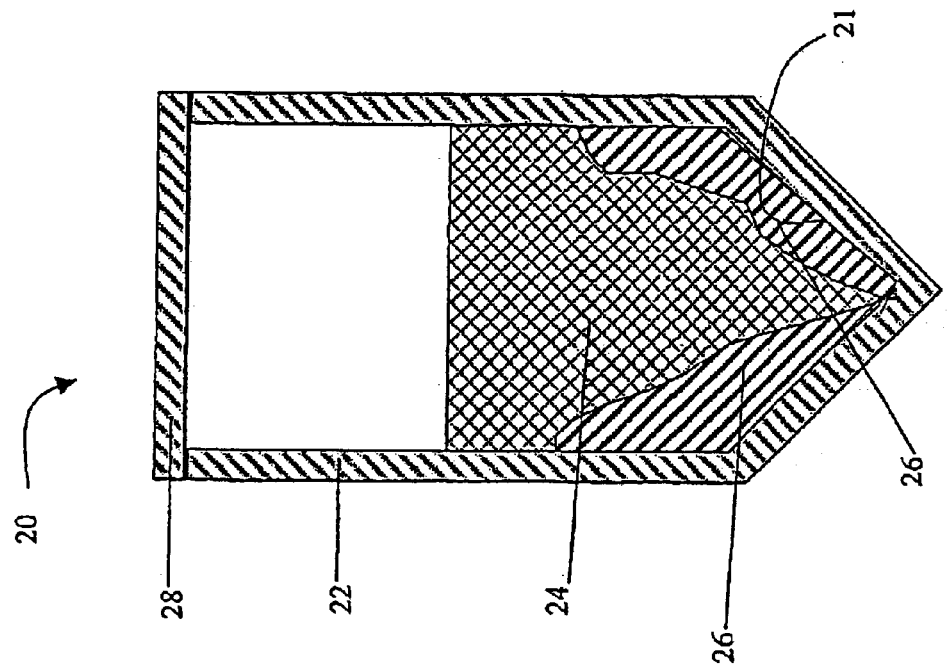
FIG. 2 shows a cross-section of a prior art conical-shaped crucible using grain selection.
Figure 1:
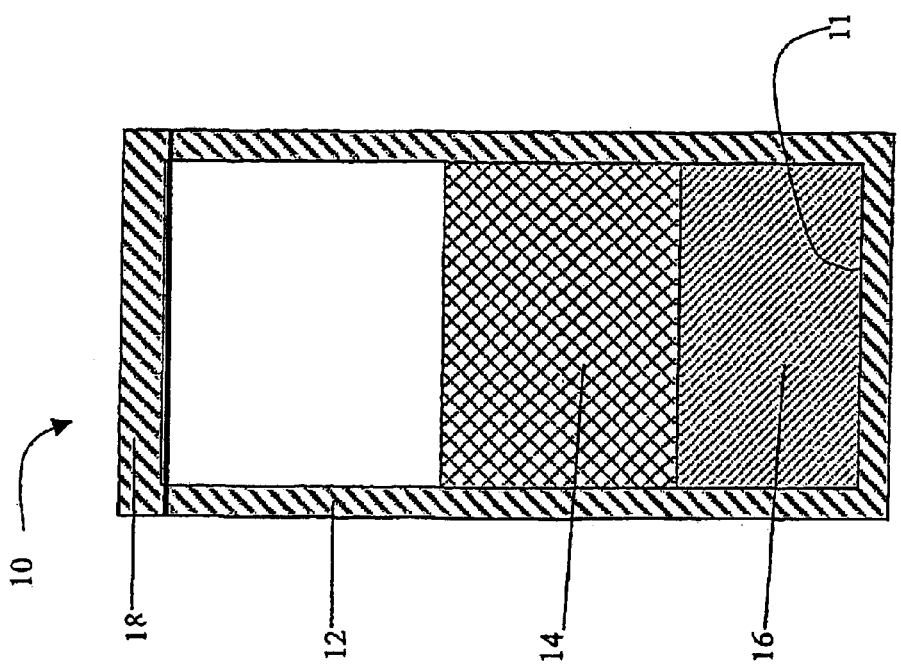
FIG. 1 shows a cross-section of a prior art flat bottomed crucible using a seed of the prior art.
Figure 3:
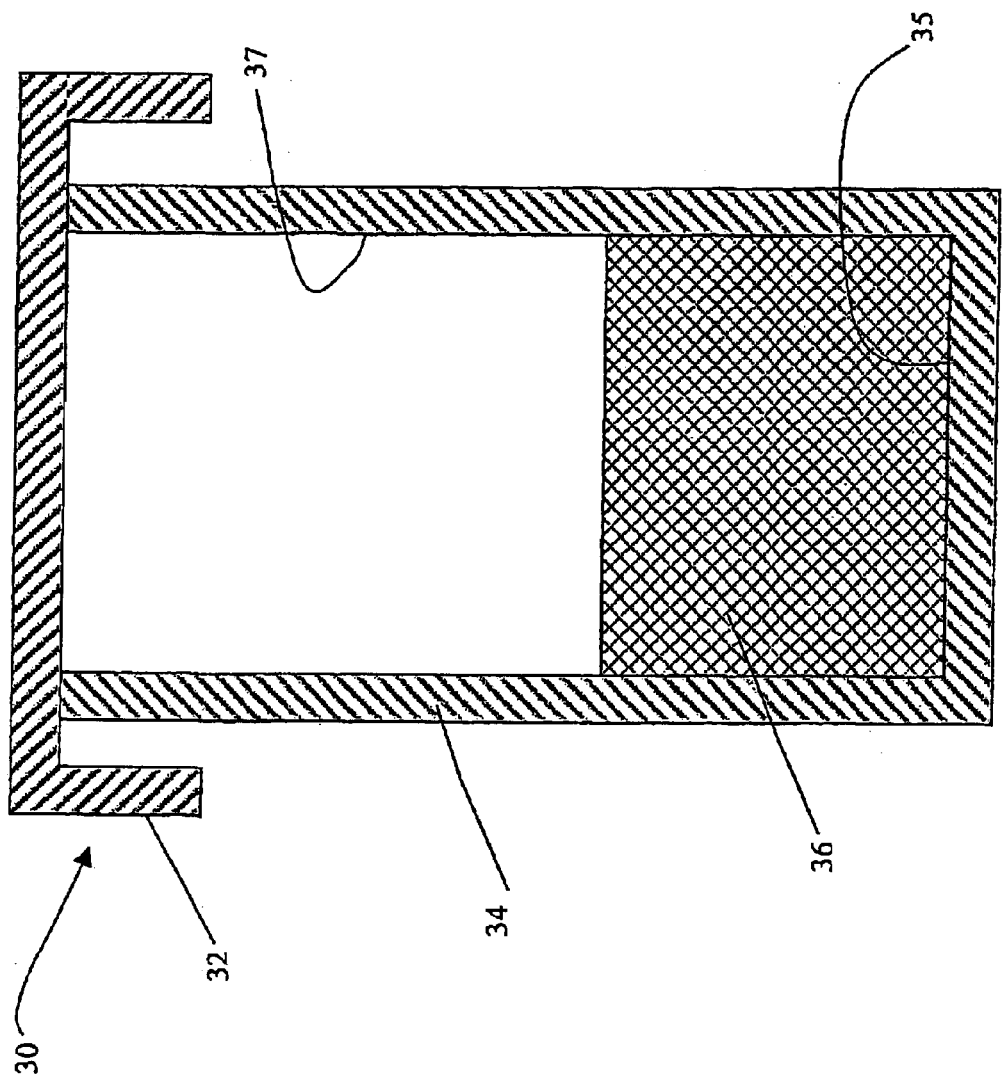
FIG. 3 shows a cross-section of a crucible configuration of the present invention.

The method of making a single grain PMN-PT crystal of the present invention is unique in that it does not rely on seeds or a conical bottomed crucible. The present method achieves a single crystal of specific orientation from a flat-bottomed crucible. The starting materials used to make PMN-PT crystals include high purity (>99.9%) powders of $Pb_3O_4$, $MgCO_3$, $Nb_2O_5$, and $TiO_2$. Raw powders of the starting materials are weighed in desired molar ratios with excess $Pb_3O_4$ as a flux. The powder is dry mixed for a desired period of time using a tumbling mill. In accordance with the present invention, the PMN-PT starting materials are placed in a flat-bottomed crucible system 30 as shown in FIG. 3. An open topped, cylindrically shaped iridium crucible 34 having a flat bottom 35, substantially vertical sides 37 is covered with a loosely fitted alumina disk 32 and placed in a high-pressure vertical Bridgman furnace. The furnace is pressurized with an inert gas, optionally with a small partial pressure of oxygen. The contents of the crucible are heated, melted, and solidified by moving the crucible downward through and out of the heated zones of the furnace. The process provides a single crystal 34, which does not exhibit a visible region of grain selection as would be expected toward the bottom of the crucible in prior art methods. The purpose of the high pressure is to suppress the evaporation of lead oxide vapors. This feature eliminates the inconvenient requirement that the crucible be welded with a hermetic seal as in prior art methods.

Any suitable pressure may be used in the present method of making PMN-PT single crystals. The pressure in the vertical Bridgman furnace may be at least 10 atmospheres, in many cases, at least 50 atmospheres, and typically, at least 75 atmospheres. When the pressure is too low, the evaporation of lead oxide vapors may not be adequately suppressed. The pressure in the vertical Bridgman furnace may be up to 500 atmospheres, in many cases, up to 250 atmospheres, and typically, up to 100 atmospheres. The upper limit of pressure is determined by the pressure rating of the vertical Bridgman furnace. The pressure applied in the present method of making PMN-PT single crystals may vary in any range of values inclusive of those stated above.

Any suitable inert gas may be used to pressurize the vertical Bridgman furnace in the present invention. Examples of suitable inert gases include, but are not limited to, helium, neon, argon, krypton, and xenon. In one presently preferred embodiment of the present invention, the inert gas is argon.

The temperature ranges in the vertical Bridgman furnace are selected such that, as the flat-bottomed crucible 34 containing PMN-PT starting materials descends the vertical length of the vertical Bridgman furnace, the starting materials melt and crystallize as a PMN-PT single crystal. The first temperature zone encountered, which is the temperature zone nearest the top of the vertical Bridgman furnace, exceeds the melting point of the PMN-PT starting materials. Thus, when the starting material laden crucible 34 encounters the first temperature zone, the starting materials melt. As the crucible continues to descend, it is exposed to successive temperature zones. At least one of which, a second temperature zone, is lower than the melting point of the PMN-PT starting materials. The bottom 35 of the crucible is first exposed to the second temperature zone, and crystallization of the PMN-PT begins at the bottom of the crucible. The single crystal continues to grow toward the top of the crucible as the crucible continues to descend the length of the vertical Bridgman furnace, until the entire crucible is exposed to the temperatures of the second temperature zone or lower temperatures.

The temperature of first temperature zone of the vertical Bridgman furnace is greater than 1,300° C., in many cases at least 1,350° C., typically at least 1,375° C. and in some cases at least 1,400° C. When the temperature of the first temperature zone is too low, the PMN-PT materials may not melt completely, precluding formation of the desired PMN-PT single crystal material. The temperature of the first temperature zone of the vertical Bridgman furnace is not more than 1,800° C., in many cases not more than 1,700° C., typically not more than 1,600° C. and in some cases not more than 1,500° C. The materials of construction of the vertical Bridgman furnace limit how high the temperature of the first temperature zone may be. When it is too high, the vertical Bridgman furnace can become damaged. In a presently preferred embodiment, the temperature of the first temperature zone is 1420° C. The temperature of the first temperature zone may vary in any range of values inclusive of those stated above.

The temperature of second temperature zone of the vertical Bridgman furnace is not more than 1,300° C., in many cases not more than 1,290° C., typically not more than 1,275° C. and in some cases not more than 1,250° C. When the temperature of the second temperature zone is too high, the PMN-PT materials may not crystallize completely, precluding formation of the desired PMN-PT single crystal material. The temperature of the second temperature zone of the vertical Bridgman furnace is not less than 1,000° C., in many cases not less than 1,100° C., typically not less than 1,150° C. and in some cases not less than 1,200° C. When the temperature of the second temperature zone is too low, the desired temperature gradient cannot be achieved and a polycrystalline material or multi grain crystal may result. In a presently preferred embodiment, the temperature of the second temperature zone is less than 1,300° C. The temperature of the second temperature zone may vary in any range of values inclusive of those stated above.

The temperature of temperature zone 1 and the temperature of temperature zone 2 create a temperature gradient in the vertical Bridgman furnace. The temperature gradient in the vertical Bridgman furnace is at least 10° C./cm, in many cases at least 15° C./cm, typically at least 17.5° C./cm and in some cases at least 20° C./cm. When the temperature gradient is too low, a polycrystalline material or multi grain crystal may result and not the desired PMN-PT single crystal material. The temperature gradient of the vertical Bridgman furnace is not more than 50° C./cm, in many cases not more than 45° C./cm, typically not more than 40° C./cm and in some cases not more than 35° C./cm. When the temperature gradient is too high, a polycrystalline material or multi grain crystal may result and not the desired PMN-PT single crystal material. In a presently preferred embodiment, the temperature gradient is 25° C./cm. The temperature gradient of the vertical Bridgman furnace may vary in any range of values inclusive of those stated above.

The rate at which the crucible is moved downward through the vertical Bridgman furnace is at least 0.2 mm/hour, often times at least 0.3 mm/hour and typically 0.4 mm/hour. When the descent of the crucible is too slow, the production of the PMN-PT single crystal may not be economical on a commercial scale. The rate at which the crucible is moved downward through the vertical Bridgman furnace is not faster than 12 mm/hour, often not faster than 10 mm/hour, typically not faster than 8 mm/hour and in some cases not faster than 5 mm/hour. When the descent of the crucible is too fast, a polycrystalline material or multi grain crystal may result and not the desired PMN-PT single crystal material. In a presently preferred embodiment, the rate of descent is 0.4 mm/hr. The rate of descent of the crucible in the vertical Bridgman furnace may vary in any range of values inclusive of those stated above.

Of course, as will readily occur to persons skilled in the art, rather than moving the crucible through stationary first and second temperature zones as described herein, the crucible may, alternatively, be stationary while the temperature gradient produced by the first and second temperature zones is movable relative to the crucible. This could be accomplished by way of a suitable, known furnace control system to sequentially regulate the heat input along the vertical height of the stationary crucible so as to duplicate the moving temperature gradient of the first and second temperature zones as described hereinabove.

The PMN-PT single crystal produced by the present method is at least 0.1 inches, in some cases at least 0.25 inches, typically at least 0.5 inches and in some cases at least 1 inch in diameter. The diameter of the PMN-PT single crystal will be dictated by its end use application. The PMN-PT single crystal is not more than 8 inches, in some cases not more than 6 inches, typically not more than 5 inches and in some cases not more than 4 inches in diameter. When the diameter of the forming single crystal is too large, a proper gradient and freeze front may not be maintained in the PMN-PT material and a polycrystalline material or multi grain crystal may result and not the desired PMN-PT single crystal material. The diameter of the PMN-PT single crystal may vary in any range of values inclusive of those stated above.

The thickness of the PMN-PT single crystal produced by the present method is at least 0.1 inches, in some cases at least 0.2 inches, typically at least 0.3 inches and in some cases at least 0.4 inches. The thickness of the PMN-PT single crystal will be dictated by its end use application. The thickness of the PMN-PT single crystal is not more than 5 inches, in some cases not more than 4 inches, typically not more than 3 inches and in some cases not more than 2 inches. When the thickness of the forming single crystal is too large, a proper gradient may not be obtainable due to the size of the vertical Bridgman furnace employed. The thickness of the PMN-PT single crystal may vary in any range of values inclusive of those stated above.

In a presently preferred embodiment, the PMN-PT single crystal is 2 inches in diameter and 0.5 inches thick.

The crystals produced using the method of the present invention are compositions and crystallographic orientations of single crystals of (n−1)PMN-(n)PT solid solutions, which obtain ultrahigh electromechanical coupling and avoid induced phase transitions during transducer fabrication and driving. The resulting crystals display a single crystal of orientation substantially in the [110] direction. Grain selection occurs very rapidly, and a region of grain selection is not apparent from the first to solidify material in contact with the bottom of the crucible in the present method. This is an unexpected finding, as crystals grown under these conditions typically grow polycrystalline, and if large grains are achieved, they occur after a period of grain selection where dominant grains grow at the expense of smaller ones. For example, prior art processes leave a region where the dominant grain growth can be observed and the complete grain may be only 2 inches in diameter and 0.5 inches in length. Thus, the resulting crystal is typically a single grain PMN-PT crystal.

Not wishing to be limited to any single theory, it is believed that the properties of the iridium material of crucible 34 may provide an explanation for the unexpected advantages of the present method. Iridium (Ir) and lead (Pb) may form an Ir—Pb phase, which is a solid at and above the melting point of the PMN-PT material. The lead oxide in PMN-PT tends to decompose, leaving elemental lead to react with the iridium in the crucible to form a thin layer of Ir—Pb. Assuming that the Ir—Pb layer forms with an orientation of [100], the b and c axes would lie in the layer forming a 4 angstrom by 5.6 angstrom lattice. PMN-PT growing in orientation [110] has planes normal to that direction which also have the lattice constants of 4 angstroms×5.6 angstroms. Thus, the Ir—Pb layer forms a hetero-seeding layer with matched crystal lattice dimensions to the PMN-PT. This process is referred to as Crucible Interface Seeding.

The addition of PT, which has a Curie point of 490° C., to pure PMN, shifts the Curie point, Tc, of the composition towards higher temperatures. A region of the phase diagram of PMN-PT (temperature versus ratio of PMN to PT) includes a morphotropic phase boundary (MPB). The MPB lies between 0.32–0.35 fractional PT composition and is piezoelectric in nature. Materials with this composition are excellent candidates for piezoelectric transducers, due to optimization of their physical properties.

Compositionally, the PMN-PT single crystals made using the method of the present invention lie near the MPB between the tetragonal and rhombohedral phases. MPB compositions have anomalously high dielectric and piezoelectric properties as a result of enhanced polarizability arising from coupling between two equivalent energy states, i.e., the tetragonal and rhombohedral phases, allowing optimum domain reorientation during the poling process. Further modifications using acceptor and donor dopants give a wide range of piezoelectric compositions. The electromechanical properties of the PMN-PT single crystal are enhanced when it is grown near the MPB.

The present invention is also directed to electroacoustic transducers that include the single crystal PMN-PT prepared using the method described above.

In addition, the present invention is directed to devices that include such electroacoustic transducers to detect or generate acoustic waves. Such devices are typically utilized in various military, medical, and industrial sonic transduction applications.

Examples of military sonic transduction applications include, but are not limited to, sonar devices, mine detection devices and hydrophone devices. Examples of medical sonic transduction applications include, but are not limited to, ultrasonic therapy devices, ultrasonic body fat measuring devices and ultrasonic imaging devices. Examples of industrial sonic transduction applications include, but are not limited to, ultrasonic devices for assessing the structural properties of wooden members, measuring animal backfat, fill level monitoring, flow rate measurement, and for inspecting rods used in the core of nuclear reactors.

The present invention has been described with reference to specific details of particular embodiments thereof. It is not intended that such details be regarded as limitations upon the scope of the invention except insofar as and to the extent that they are included in the accompanying claims.

I claim:

1. A method of making a single crystal of lead magnesium niobate-lead titanate (PMN-PT) comprising the steps of:
   (a) providing an iridium crucible containing PMN-PT starting material;
   (b) placing the crucible containing the PMN-PT starting material into a furnace having at least two temperature zones and pressurizing the interior of said furnace with an inert gas;
   (c) establishing at least:
      (i) a first temperature zone having a temperature higher than a melting temperature of the PMN-PT material; and
      (ii) a second temperature zone having a temperature less than the melting temperature of the PMN-PT material; and
   (d) exposing the crucible and PMN-PT starting material sequentially to said first temperature zone and then said second temperature zone.

2. The method of claim 1, wherein the PMN-PT starting material comprises high purity powders of $Pb_3O_4$, $MgCO_3$, $Nb_2O_5$, and $TiO_2$.

3. The method of claim 1, wherein the iridium crucible is covered with a loosely fitted alumina disk.

4. The method of claim 1, wherein the pressure in the furnace is from 10 to 500 atmospheres.

5. The method of claim 1, wherein the inert gas is one or more selected from the group consisting of helium, neon, argon, krypton, and xenon.

6. The method of claim 1, wherein the inert gas is argon.

7. The method of claim 1, wherein the temperature of the first temperature zone is greater than 1300° C. and the temperature of the second temperature zone is not more than 1300° C.

8. The method of claim 1, wherein the furnace is a vertical furnace and wherein the exposing step (d) includes descending the crucible in said vertical furnace at a rate of from 0.2 mm/hr to 12 mm/hr.

9. The method of claim 1, wherein the temperature of temperature zone 1 and the temperature of temperature zone 2 create a temperature gradient in the furnace and said temperature gradient is from 10° C./cm to 50° C./cm.

10. The method of claim 1, wherein in addition to the inert gas, a small partial pressure of oxygen is used to pressurize the furnace.

11. The method of claim 1, wherein the single crystal of PMN-PT is a single grain crystal of a (n−1)PMN-(n)PT solid solution exhibiting [110] crystal orientation.

12. The method of claim 1 wherein the exposing step (d) includes establishing sequentially controlled first and second temperature zones wherein the zones define a temperature gradient therebetween and wherein the temperature gradient moves relative to said crucible.

13. A method of making a single grain crystal of lead magnesium niobate-lead titanate ((n−1)PMN-(n)PT) exhibiting a crystal orientation substantially in a [110] direction by crucible interface seeding comprising the steps of:
   (a) providing a flat-bottomed iridium crucible containing lead magnesium niobate-lead titanate (PMN-PT) starting material comprising $Pb_3O_4$, $MgCO_3$, $Nb_2O_5$, and $TiO_2$;
   (b) placing the crucible containing the PMN-PT starting material into a vertical Bridgman furnace having at least two temperature zones and pressurizing the interior of the furnace to a pressure of from 75 to 100 atmospheres with argon; and
   (c) descending the crucible sequentially into the temperature zones of the vertical Bridgman furnace, where the temperature zones include:
      (i) a first temperature zone having a temperature higher than a melting temperature of the PMN-PT material; and
      (ii) a second temperature zone having a temperature less than the melting temperature of the PMN-PT material.

14. The method of claim 13, wherein the iridium crucible is covered with a loosely fitted alumina disk.

15. The method of claim 13, wherein the temperature of the first temperature zone is greater than 1300° C. and the temperature of the second temperature zone is not more than 1300° C.

16. The method of claim 13, wherein the crucible descends at a rate of from 0.2 mm/hr to 12 mm/hr.

17. The method of claim 13, wherein the temperature of temperature zone 1 and the temperature of temperature zone 2 create a temperature gradient in the vertical Bridgman furnace and said temperature gradient is from 10° C./cm to 50° C./cm.

18. The method of claim 13, wherein in addition to the inert gas, a small partial pressure of oxygen is used to pressurize the vertical Bridgman furnace.

* * * * *